US007089477B1

(12) United States Patent
Divsalar et al.

(10) Patent No.: US 7,089,477 B1
(45) Date of Patent: Aug. 8, 2006

(54) INTERLEAVED SERIAL CONCATENATION FORMING TURBO-LIKE CODES

(75) Inventors: Dariush Divsalar, Pacific Palisades, CA (US); Robert J. McEliece, Pasadena, CA (US); Hui Jin, Glen Gardner, NJ (US); Fabrizio Pollara, Lacanada, CA (US)

(73) Assignee: California Institute of Technology, Pasadena, CA (US)

( * ) Notice: Subject to any disclaimer, the term of this patent is extended or adjusted under 35 U.S.C. 154(b) by 749 days.

(21) Appl. No.: 09/922,852

(22) Filed: Aug. 18, 2000

Related U.S. Application Data

(60) Provisional application No. 60/149,871, filed on Aug. 18, 1999.

(51) Int. Cl.
*H03M 13/29* (2006.01)

(52) U.S. Cl. .................................................... 714/755

(58) Field of Classification Search ................. 714/755
See application file for complete search history.

(56) References Cited

U.S. PATENT DOCUMENTS 5,392,299 A * 2/1995 Rhines et al. ............... 714/756
5,751,739 A * 5/1998 Seshadri et al. ............ 714/746
5,881,093 A * 3/1999 Wang et al. ................ 375/130
6,014,411 A * 1/2000 Wang ......................... 375/259
6,023,783 A * 2/2000 Divsalar et al. ............ 714/792
6,031,874 A * 2/2000 Chennakeshu et al. ..... 375/262
6,032,284 A * 2/2000 Bliss .......................... 714/792
6,437,714 B1 * 8/2002 Kim et al. .................... 341/81
2001/0025358 A1 * 9/2001 Eidson et al. ............... 714/752

OTHER PUBLICATIONS

Wiberg et al., "Codes and Iterative Decoding on General Graphs", 1995 Intl. Symposium on Information Theory, Sep. 1995, p. 506.*

Divsalar, D., et al. Multiple Turbo Codes for Deep-Space Communications , The Telecommunications and Data Acquisition Progress Report 42-121 for NASA and California Institute of Technology Jet Propulsion Laboratory, Joseph H. Yuen, ed.,pp. 60-77, May 15, 1995.

Divsalar, D., et al. On the Design of Turbo Codes , The Telecommunications and Data Acquisition Progress Report 42-123 for NASA and California Institute of Technology Jet Propulsion Laboratory, Joseph H. Yuen, ed.,pp. 99-121, Nov. 15, 1995.

Divsalar, D., et al., Low-Rate Turbo Codes for Deep Space Communications , Proceedings from the 1995 IEEE International Symposium on Information Theory, Whistler, British Columbia, Canada, pp. 35, Sep. 17-22, 1995.

(Continued)

*Primary Examiner*—Stephen M. Baker
(74) *Attorney, Agent, or Firm*—Fish & Richardson P.C.

(57) ABSTRACT

A turbo-like code is formed by repeating the signal, coding it, and interleaving it. A serial concatenated coder is formed of an inner coder and an outer coder separated by an interleaver. The outer coder is a coder which has rate greater than one e.g. a repetition coder. The interleaver rearranges the bits. An outer coder is a rate one coder.

46 Claims, 6 Drawing Sheets

U
Rate 1/q Repetition
V
P
W
Rate 1 1/(1+D)
X

OTHER PUBLICATIONS

Benedetto, S., et al., Bandwidth efficient parallel concatenated coding schemes , Electronics Letters, vol. 31, No. 24, pp. 2067-2069, Nov. 23, 1995.
Divsalar, D., et al., Turbo Codes for PCS Applications , IEEE ICC 95, Seattle, WA, pp. 54-59, Jun. 1995.
Divsalar, D., et al., Multiple Turbo Codes , MILCOM 95, San Diego, CA, pp. 279-285, Nov. 5-6, 1995.
Benedetto, S., et al. Soft-Output Decoding Algorithms in Iterative Decoding of Turbo Codes , The Telecommunications and Data Acquisition Progress Report 42-124 for NASA and California Institute of Technology Jet Propulsion Laboratory, Joseph H. Yuen, ed.,pp. 63-87, Feb. 15, 1996.
Divsalar, D., et al., Effective free distance of turbo codes , Electronic Letters, vol. 32, No. 5, pp. 445-446, Feb. 29, 1996.
Benedetto, S., et al. Serial Concatenation of Interleaved Codes: Performance Analysis, Design, and Iterative Decoding , The Telecommunications and Data Acquisition Progress Report 42-126 for NASA and California Institute of Technology Jet Propulsion Laboratory, Joseph H. Yuen, ed.,pp. 1-26, Aug. 15, 1996.
Benedetto, S., et al. A Soft-Input Soft-Output Maximum A Posteriori (MAP) Module to Decode Parallel and Serial Concatenated Codes , The Telecommunications and Data Acquisition Progress Report 42-127 for NASA and California Institute of Technology Jet Propulsion Laboratory, Joseph H. Yuen, ed.,pp. 1-20, Nov. 15, 1996.
Benedetto, S., et al., Parallel Concatenated Trellis Coded Modulation , ICC 96, pp. 974-978, Jun. 1996.
Benedetto, S., et al., A Soft-Input Soft-Output APP Module for Iterative Decoding of Concatenated Codes , IEEE Communication Letters, vol. 1, No. 1, pp. 22-24, Jan. 1997.
Divsalar, D., et al., Hybrid Concatenated Codes and Iterative Decoding , Proceedings from the IEEE 1997 International Symposium on Information Theory, Ulm, Germany, p. 10, Jun. 29-Jul. 4, 1997.
Benedetto, S., et al., Serial Concatenation of interleaved codes: performance analysis, design, and iterative decoding, Proceedings from the IEEE 1997 International Symposium on Information Theory, Ulm, Germany, p. 106, Jun. 29-Jul. 4, 1997.
Benedetto, S., et al., Serial Concatenated Trellis Coded Modulation with Iterative Decoding , Proceedings from the IEEE 1997 International Symposium on Information Theory, Ulm, Germany, p. 8, Jun. 29-Jul. 4, 1997.
Benedetto, S., et al., Design of Serially Concatenated Interleaved Codes , ICC 97, Montreal, Canada, pp. 710-714, Jun. 1997.

* cited by examiner

INTERLEAVED SERIAL CONCATENATION FORMING TURBO-LIKE CODES

CROSS-REFERENCE TO RELATED APPLICATIONS

The present application claims benefit of U.S. Provisional Application No. 60/149,871, filed Aug. 18, 1999.

The work described herein may have been supported by Grant Nos. NCR 9505975, awarded by the National Science Foundation, and 5F49620-97-1-0313 awarded by the Air Force. The U.S. Government may have certain rights to this invention.

BACKGROUND

Properties of a channel affect the amount of data that can be handled by the channel. The so-called "Shannon limit" defines the theoretical limit on the amount of data that a channel can carry.

Different techniques have been used to increase the data rate that can be handled by a channel. "Near Shannon Limit Error-Correcting Coding and Decoding: Turbo Codes," by Berrou et al. ICC, pp 1064–1070, (1993), described a new "turbo code" technique that has revolutionized the field of error correcting codes.

Turbo codes have sufficient randomness to allow reliable communication over the channel at a high data rate near capacity. However, they still retain sufficient structure to allow practical encoding and decoding algorithms. Still, the technique for encoding and decoding turbo codes can be relatively complex.

A standard turbo coder is shown in FIG. 1. A block of k information bits 100 is input directly to a first encoder 102. A k bit interleaver 110 also receives the k bits and interleaves them prior to applying them to a second encoder 104. The second encoder produces an output that has more bits than its input, that is, it is a coder with a rate that is less than 1.

The encoders 102, 104 are also typically recursive convolutional coders.

Three different items are sent over the channel 150: the original k bits 100, first encoded bits 110, and second encoded bits 112.

At the decoding end, two decoders are used: a first constituent decoder 160 and a second constituent decoder 162. Each receives both the original k bits, and one of the encoded portions 110, 112. Each decoder sends likelihood estimates of the decoded bits to the other decoders. The estimates are used to decode the uncoded information bits as corrupted by the noisy channel.

SUMMARY

The present application describes a new class of codes, coders and decoders: called "turbo-like" codes, coders and decoders. These coders may be less complex to implement than standard turbo coders.

The inner coder of this system is rate 1 encoder, or a coder that encodes at close to rate 1. This means that this coder puts out a similar number of bits to the number it takes in. Fewer bits are produced as compared with other systems that use rate less than 1 as their inner coder.

The system can also use component codes in a serially concatenated system. The individual component codes forming the overall code may be simpler than previous codes. Each simple code individually might be considered useless.

More specifically, the present system uses an outer coder, an interleaver, and inner coder. Optional components include a middle coder 305, where the middle coder can also include additional interleavers.

The inner coder 200 is a linear rate 1 coder, or a coder whose rate is close to 1.

Unlike turbo coders that produce excess information in their final coder, the present system uses a final coder which does not increase the number of bits. More specifically, however, the inner coder can be one of many different kinds of elements.

DETAILED DESCRIPTION

Figure 1:
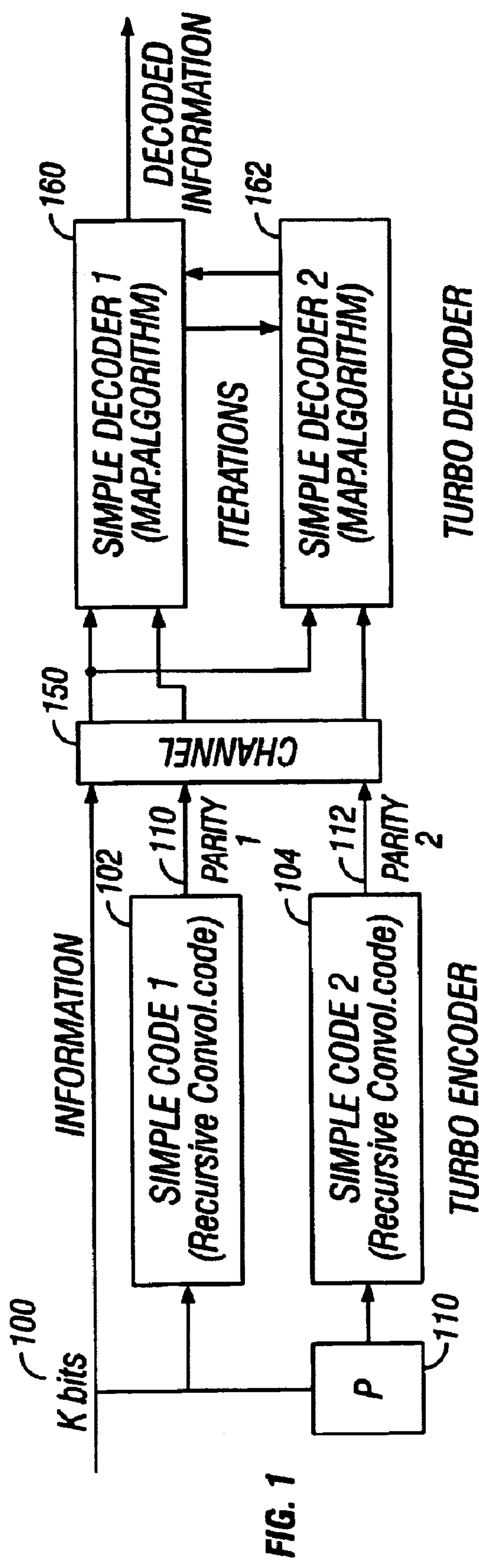
FIG. 1 shows a prior "turbo code" system.
Figure 2:
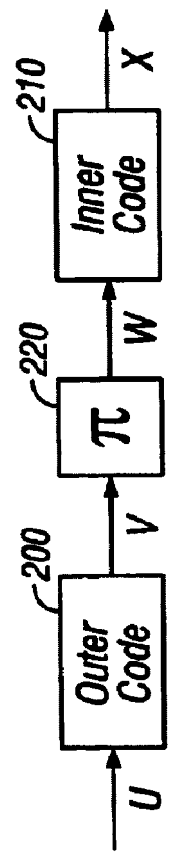
FIG. 2 shows a generic turbo-like coder in its most general form with a single rate 1 inner coder, single outer coder, and a single interleaver.

An embodiment of the present system, in its most general form, is shown in FIG. 2. In general, this system has two encoders: an outer coder 200 and an inner coder 210 separated by an interleaver 220.

Encoder 200 is called an outer encoder, and receives the uncoded data. The outer coder can be an (n,k) binary linear encoder where n>k. The means that the encoder 200 accepts as input a block u of k data bits. It produces an output block v of n data bits. The mathematical relationship between u and v is $v=T_0u$, where $T_0$ is an n×k binary matrix. In its simplest form, the outer coder may be a repetition coder. The outer coder codes data with a rate that is less than 1, and may be, for example, ½ or ⅓.

The interleaver 220 performs a fixed pseudo-random permutation of the block v, yielding a block w having the same length as v.

The inner encoder 210 is a linear rate 1 encoder, which means that the n-bit output block x can be written as $x=T_Iw$, where $T_I$ is a nonsingular n×n matrix. Encoder 210 can have a rate that is close to 1, e.g., within 50%, more preferably 10% and perhaps even more preferably within 1% of 1.

Figure 8:
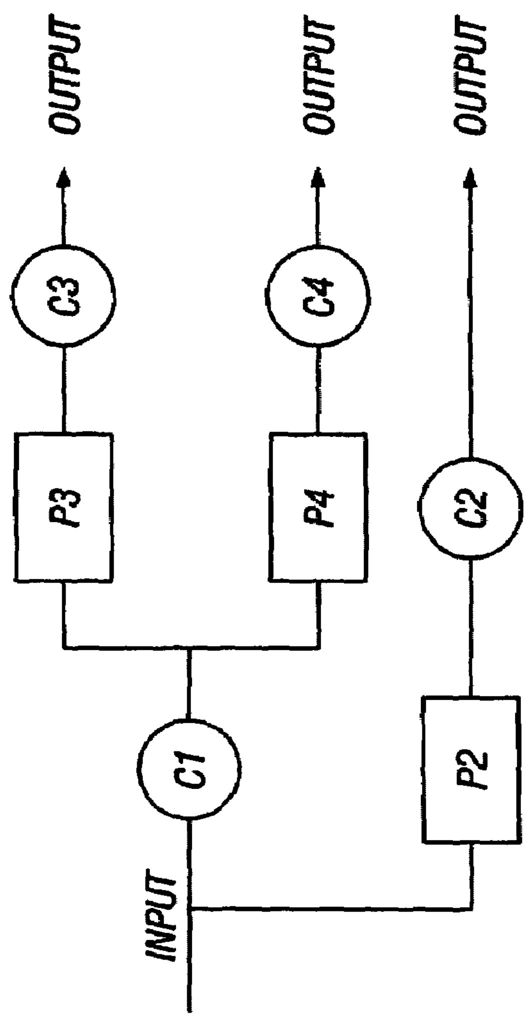
FIG. 8 shows a tree structure with a second branch.

The overall structure of coders such as the one in FIG. 8 has no loops, i.e., it is not "recursive" between coders. The whole operation proceeds by a graph theoretic tree. A tree structure can simplify the overall operation.

A number of different embodiments will be described herein, all of which follow the general structure of FIG. 2 which includes the first outer coder 200 (rate <1), which can be an encoder for a binary (n,k) linear block code; a pseudo random interleaver 220 which receives the output (rate 1), and a rate 1 inner coder 210 that codes the interleaved output.

Figure 3:
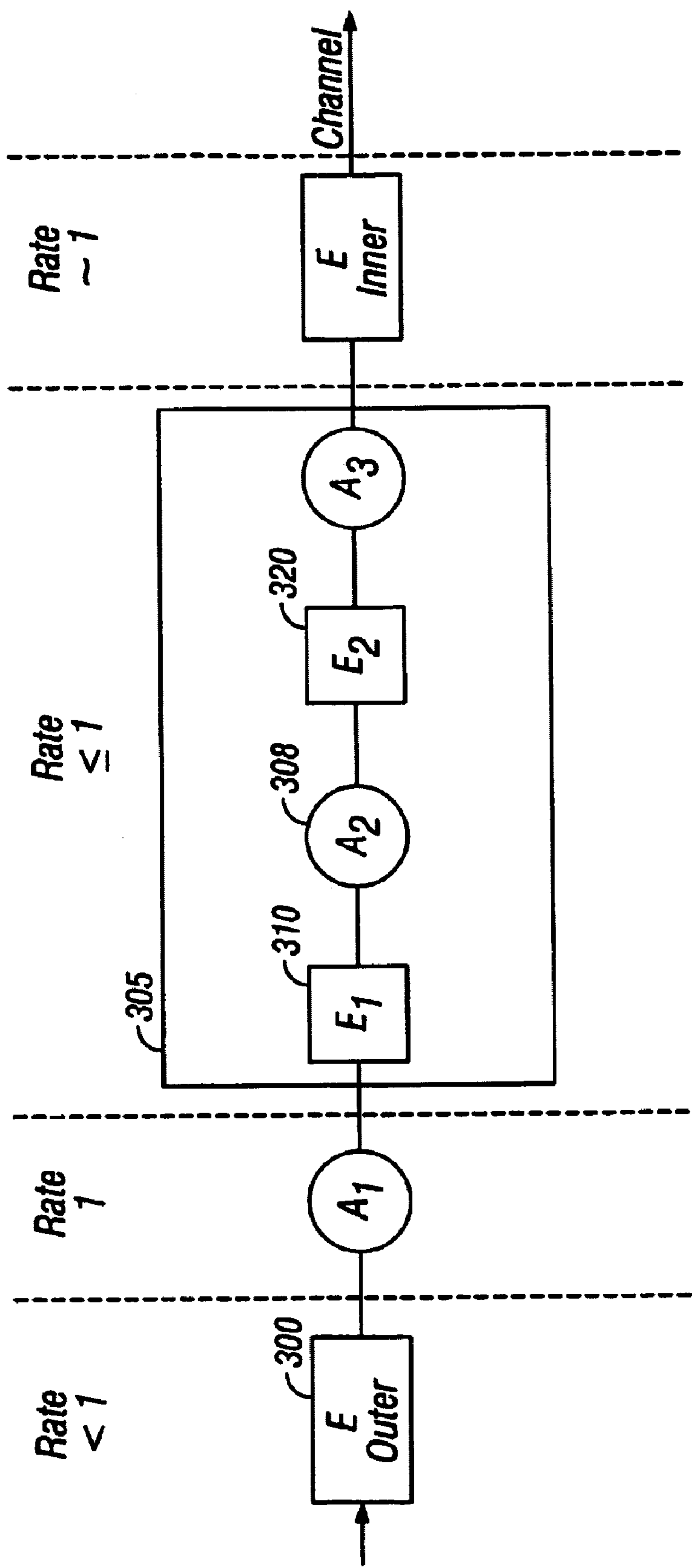
FIG. 3 shows a x=4 coder.

More generally, there can be more than 2 encoders: there can be x encoders, and x−1 interleavers. The additional coder can be generically shown as a middle coder. FIG. 3 shows four encoders 300, 310, 320, 330. Three of these coders; here 310, 320, 330; are rate 1 encoders. The outer encoder 300 is an (n,k) linear block coding encoder. Three pseudorandom interleavers 340, 350, 360 separate the rate 1 coders from the outer coder 300. The middle coder, in general, has a rate less than or equal to 1.

A number of embodiments of the coders are described including a repeat and accumulate ("RA") coder, a repeat double accumulate ("RDD") coder and a repeat accumulate accumulate ("RAA") coder.

The RA coder includes an outer coder and an inner coder connected via a pseudorandom interleaver. The outer code uses a simple repetition code, and the inner code is a rate 1 accumulator code. The accumulator code is a truncated rate 1 convolutional code with transfer function 1/(1+D). Further details are provided in the following.

Figure 4:
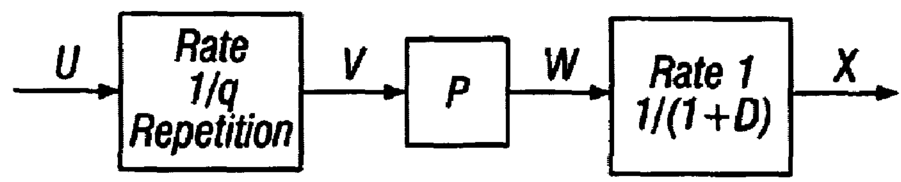
FIGS. 4 and 5 show a repeat and accumulate coder.
Figure 5:
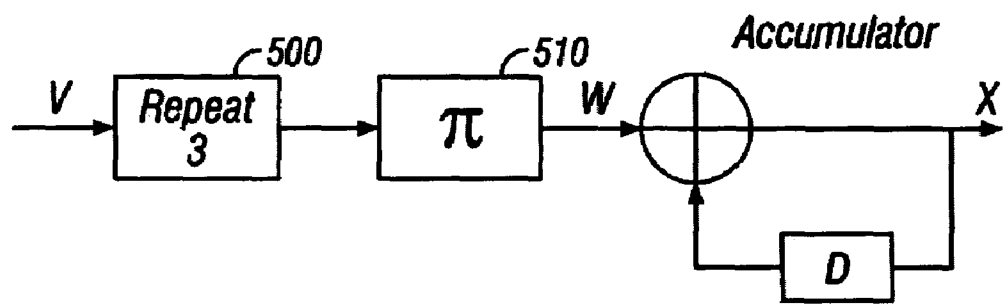

FIGS. 4 and 5 show two versions of encoder systems for the basic repeat and accumulate code, using the general structure described above. An information block 400 of length k is input to the outer coder 405, here a rate 1/q repetition element. The device 405 replicates the input block q times to produce an information block 410 of length qk. The replication may be carried out a subblock at a time. information 410 is then interleaved by a qk×qk permutation matrix to form information block of length qk 420. This block is then encoded by an accumulator 425. In FIG. 5, this accumulator 510 is a truncated rate 1 recursive convolutional coder with transfer function 1/(1+D). Looking at this accumulator mathematically, it can be seen as a block code whose input block $\{x_1, \ldots, x_n\}$ and output block $\{y_1, \ldots, y_n\}$ are related by the formula $$y_1 = x_1$$
$$y_2 = x_1 \oplus x_2$$
$$y_3 = x_1 \oplus x_2 \oplus x_3$$
$$\vdots$$
$$y_n = x_1 \oplus x_2 \oplus x_3 + \cdots + x_n$$

In the q=3 embodiment of the encoder, a block of k data bits (u[1],u[2], . . . ,u[k]), (the u-block) is subjected to a three-stage process which produces a block of 3k encoded bits (x[1],x[2], . . . ,x[3k]) (the x-block). This process is depicted in FIG. 5.

Stage 1 of the encoding process forms the outer encoder stage. This system uses a repetition code. The input "u" block (u[1], . . . ,u[k]) is transformed into a 3k-bit data block (v[1],v[2], . . . ,v[3k]) (the v-block). This is done by repeating each data bit 3 times, according to the following rule:

$$v[1] = v[2] = v[3] = u[1]$$
$$v[4] = v[5] = v[6] = u[2]$$
$$\vdots \quad \vdots$$
$$v[3k-2] = v[3k-1] = u[3k] = u[k].$$

Stage 2 of the encoding process is the interleaver 510. The interleaver converts the v-block into the w-block as follows:

$$w[1] = v[\pi[1]]$$
$$w[2] = v[\pi[2]]$$
$$\vdots$$
$$w[3k] = v[\pi[3k]],$$

and π[1], π[2], . . . ,π[3k] is a fixed permutation of the set {1, 2, . . . , kq} for this case of q=3.

Stage 3 of the encoding process is the accumulator 520. This converts the w-block into the x-block by the following rule:

$$x[1] = w[1]$$
$$x[2] = x[1] \oplus w[2]$$
$$x[3] = x[2] \oplus w[3]$$
$$\vdots$$
$$x[kq] = x[kq-1] \oplus w[kq],$$

Where "⊕" denotes modulo two, or exclusive or, addition. An advantage of this system is that only mod 2 addition is necessary for the accumulator. That means that the accumulator can be embodied using only exclusive or (xor) gates. This can simplify the design.

The accumulator 520 can alternatively be represented as a digital filter with transfer function equal to 1/(1+D) as shown in 425.

The RA coder is a 1/q coder, and hence can only provide certain rates, e.g. ½, ⅓, ¼, ⅕, etc. Other variations of this general system form alternative embodiments that can improve performance and provide flexibility in the desired rate.

Figure 6:
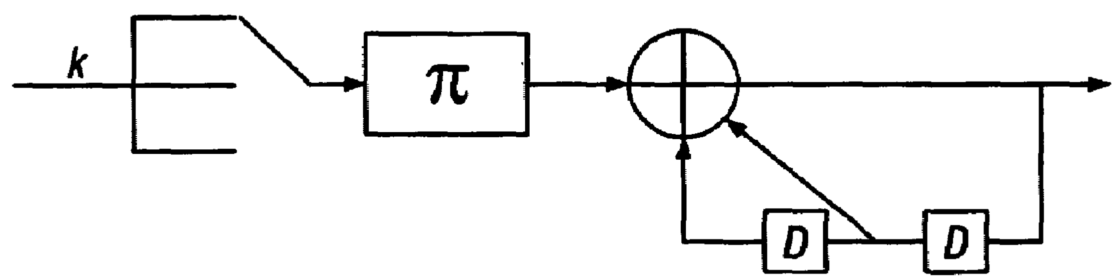
FIG. 6 shows a repeat/double accumulator coder.

One such is the "RDD" code. The encoder for RDD is shown in FIG. 6. The accumulator component of the RA code is replaced by a "double accumulator." The double accumulator can be viewed as a truncated rate 1 convolutional code with transfer function $1/(1+D+D^2)$.

Figure 7:
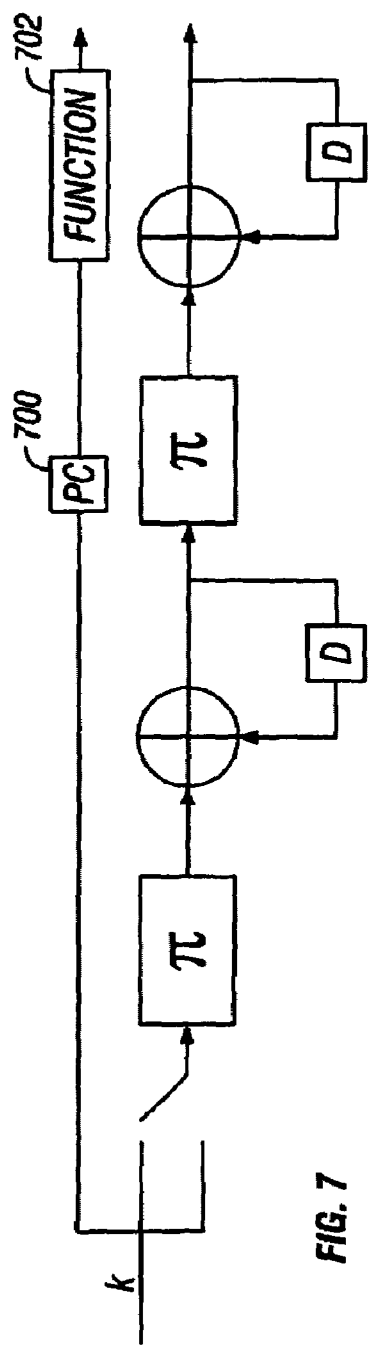
FIG. 7 shows a dual accumulator system.

In another preferred embodiment shown in FIG. 7, called the "RAA" code, there are three component codes: The "outer" code, the "middle" code, and the "inner" code. The outer code is a repetition code, and the middle and inner codes are both accumulators. The outer code has rate less than 1, the middle code are both accumulators (of rate 1) and the inner code has a rate which is 1 or close to 1.

As described above, the "repetition number" q of the first stage of the encoder can be any positive integer greater than or equal to 2. The outer encoder is the encoder for the (q, 1) repetition code.

The outer encoder can carry out coding using coding schemes other than simple repetition e.g., a parallel concatenated code 700 as shown in FIG. 7. In the most general embodiment, the outer encoder is a (q, k) block code. For example, if k is a multiple of 4, the input block can be partitioned into four bit subblocks, and each 4-bit subblock can be encoded into 8 bits using an encoder for the (8,4) extended Hamming code. Any other short block code can be used in a similar fashion, for example a (23, 12) Golay code.

In general, k can be partitioned into subblocks $k_1$, $k_2$, $k_m$ such that $$\sum_{i=1}^{m} k_i = k.$$

q can be similarly partitioned. This, the k input bits can be encoded by m block codes ($q_i$, $k_i$) for any i. In general, these outer codes can be different. Truncated convolutional codes can be used as the block codes. Repetition codes can also be used as the block codes.

In a similar fashion, the q output bits of the interleaver can be partitioned into j subblocks $q'_1$, $q'_2$ . . . such that the summation of all the $q'_I$=q. Then each subblock can be encoded with a rate 1 inner code. In general these inner codes can be different recursive rate 1 convolutional codes.

The accumulator 520 in stage 3 of the encoder can be replaced by a more general device, for example, an arbitrary digital filter using modulo 2 arithmetic with infinite impulse response ("i.i.r."). FIG. 6 shows, for example, the accumulator being an i.i.r. filter with whose transfer function is $1/(1+D+D^2)$.

The system can be a straight tree, or a tree with multiple branches. FIG. 8 shows a multiple branch tree, where the outer encoder c1 feeds two interleavers p3, p4, each of which is associated with a rate 1 inner coder c3, c4. A totally separate branch has the interleaver p2, and rate 1 inner coder c2.

Some or all of the output bits from the outer encoder can be sent directly to the channel and/or to a modulator for the channel.

Any of a number of different techniques can be used for decoding such a code. For example, soft input soft output can be used with a posteriori probability calculations to decode the code.

A specific described decoding scheme relies on exploiting the Tanner Graph representation of an RA code.

Figure 9:
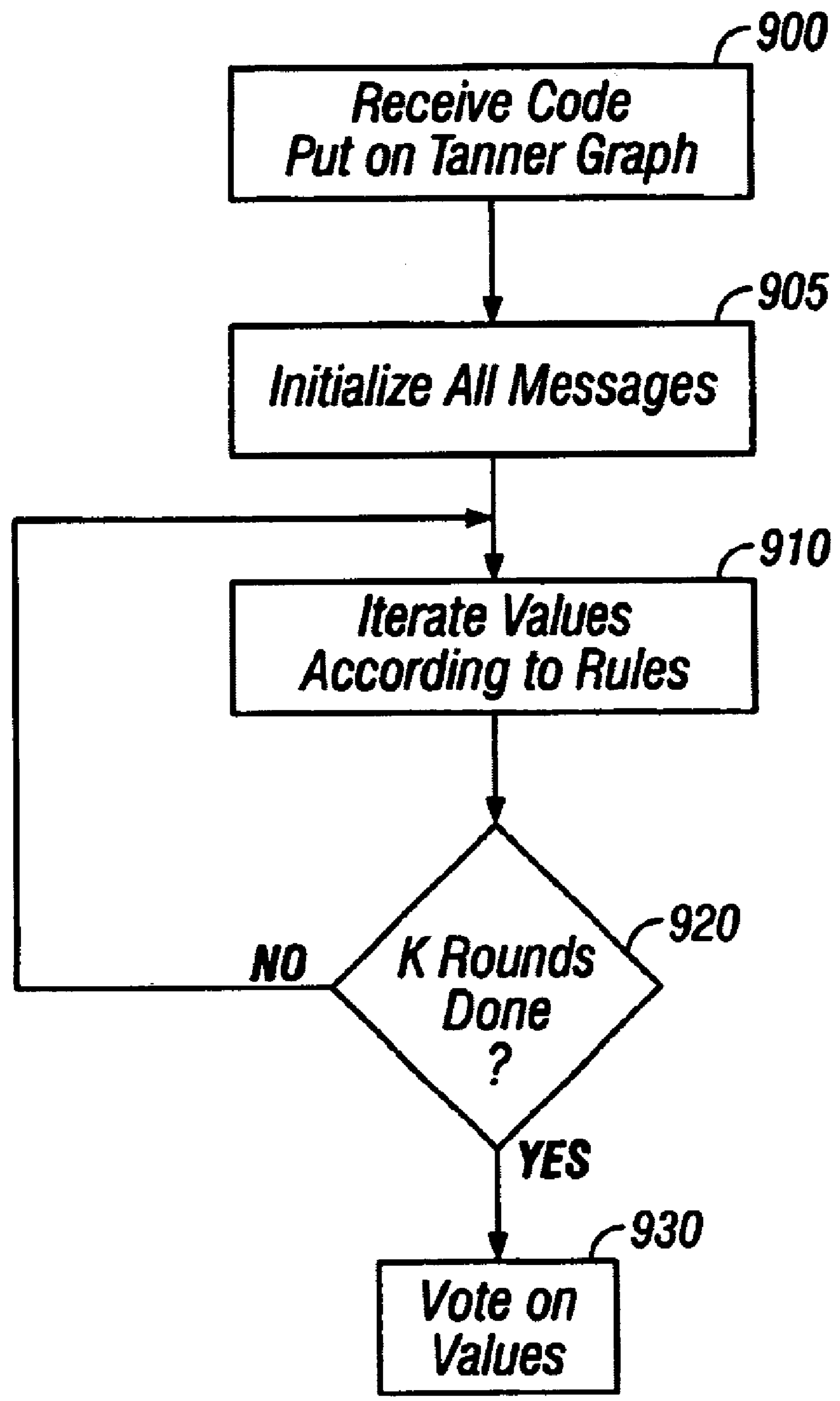
FIG. 9 shows a flow chart of Tanner Graph decoding.

FIG. 9 shows a flowchart of operation. The code is received, and a Tanner Graph is used to describe the essential structure of the code on a graph at 800.

Roughly speaking, a Tanner Graph G=(V,E) is a bipartite graph whose vertices can be partitioned into variable nodes Vm and check nodes $V_c$, where edges $E \subseteq V_m X V_c$. Check nodes in the Tanner Graph represent certain "local constraints" on a subset of variable nodes. An edge indicates that a particular variable is present in a particular constraint.

The Tanner Graph realization for an RA code is explained with reference to FIG. 10. For a repetition q type RA code with block length k, the k information bits can be denoted by i=1,2, . . . n, the qk code bits by $y_i$, and the intermediate bits (which are the outputs of the outer code and the inputs to the inner code) by $x_i$. $y_i$ and $x_i$ are related by the formula $$y_i = \begin{cases} x_i & \text{if } i = 1, \\ x_i + y_{i-1} & \text{otherwise.} \end{cases}$$

Notice that every $x_i$ is a replica of some $u_j$. Therefore, all qk equations in the above can be represented by check nodes $c_i$. These check nodes represent both information bits $u_i$ and code bits $y_i$ by variable nodes with the same symbol.

Edges can be naturally generated by connecting each check node to the $u_i$ and $y_i$s that are present in its equation. Using notation C={$c_i$}, U={$u_i$} Y={$y_i$} provides a Tanner Graph representation of an RA code, with $V_m$=U∪Yand $V_c$=C.

Figure 10:
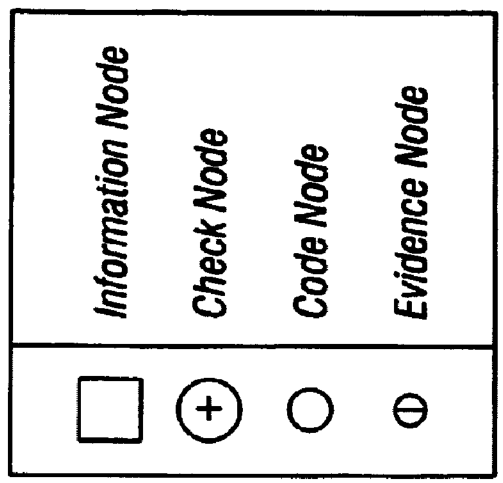
FIG. 10 shows the actual Tanner Graph decoding.
Figure 10:
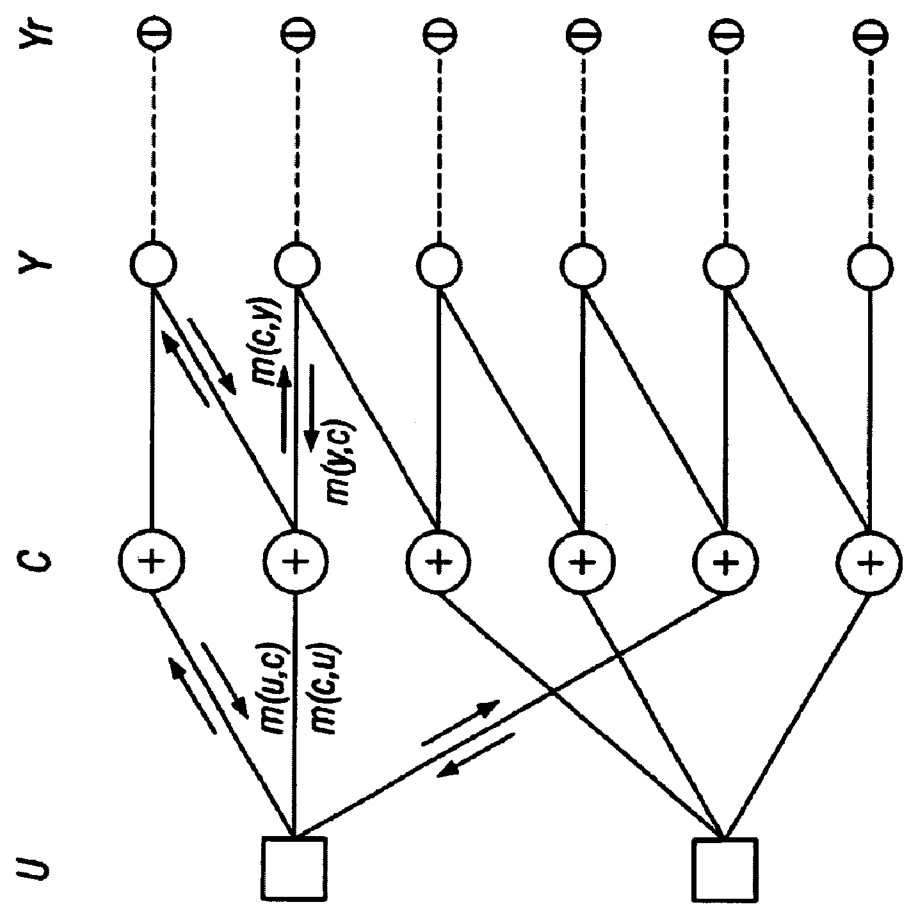

FIG. 10 shows such a Tanner Graph specifically for a q=3, k=2 (repetition 3 block length 2) RA code, with permutation π=(1, 2, 5, 3, 4, 6). This graph also shows the received version of code bits y through the channel, which are denoted by $y_r$. Although the received bits $y_r$ may provide evidence or confirmation in the decoding procedure, they are not strictly part of the Tanner Graph.

Generally, in the Tanner Graph for a repetition q RA code, every $u_i$ is present in q check nodes regardless of the block length k. Hence every vertex u∈U has degree q. Similarly, every vertex c∈C has degree 3 (except the first vertex $c_1$ which has degree 2), and every vertex y E Y has degree 2 (except the last vertex $y_{qk}$, which has degree 1.

"Belief propagation" on the Tanner Graph realization is used to decode RA codes at 910. Roughly speaking, the belief propagation decoding technique allows the messages passed on an edge e to represent posterior densities on the bit associated with the variable node. A probability density on a bit is a pair of non-negative real numbers $p_o$, $p_1$ satisfying $p_o+p_1=1$, where $p_o$ denotes the probability of the bit being 0, $p_1$ the probability of it being 1. Such a pair can be represented by its log likelihood ratio log $$\frac{p_1}{p_o}.$$

It can be assumed that the messages here use this representation.

There are four distinct classes of messages in the belief propagation decoding of RA codes, namely messages sent (received) by some vertex u∈U to (from) some vertex c∈C, which are denoted by m[u,c] (m[c,u]), and messages sent (received) by some vertex y∈Y to (from some vertex c∈C, which are denoted by m[y,c] (m[c,y]). Messages are passed along the edges, as shown in FIG. 10. Both m[u,c] and m[c,u]have the conditional value of log $$\frac{p(u=1)}{p(u=0)},$$

both m[y,c] and m[c,y] have the conditional value of log $$\frac{p(y=1)}{p(y=0)}.$$

Each code node of y also has the belief provided by received bit $y_r$, which value is denoted by B(y)=log $$\frac{p(y=1/y_r)}{p(y=0/y_r)}.$$

With all the notations introduced, the belief propagation decoding of an RA code can be described as follows:

Initialize all messages m[u,c], m[c,u], m[y,c],m[c,y] to be zero at 905. Then interate at 910. The messages are continually updated over K rounds at 920 (the number K is predetermined or is determined dynamically by some halting rule during execution of the algorithm). Each round is a sequential execution of the following script:

Update m[y,c]:

$$m[y, c] = \begin{cases} B(y) & \text{if } y = y_{qk}, \\ B(y) + m[c', y] & \text{otherwise, where } (c', y) \in E \text{ and } c' \neq c. \end{cases}$$

Update m[c,u]:

$$m[c, u] = \begin{cases} m[y, c] & \text{if } c = c_1, \text{ where } (y, c) \in E \text{ and } y \in Y, \\ \log\frac{e^{m[y,c]} + e^{m[y',c]}}{1 + e^{m[y,c]+m[y',c]}} & \text{otherwise, where } (y, c), (y', c) \in E \text{ and } y \neq y' \in Y. \end{cases}$$

Update m[u,c]:

$m[u,c]\pi_{c'} m[u,c']$, where $(u,c')\in E$ and $c'\neq c$.

Update m[c,y]:

$$m[c, y) = \begin{cases} m[u, c] & \text{if } c = c_1, \text{ where } (u, c) \in E \text{ and } u \in U, \\ \log\frac{e^{m[u,c]} + e^{m[y',c]}}{1 + e^{m[u,c]+m[y',c]}} & \text{otherwise, where } (u, c), (y', c) \in E \text{ and } y \neq y' \in Y. \end{cases}$$

Upon completion of the K iterative propagations, the values are calculated based on votes at 930. Specifically, compute $$S_u = \sum_c m[u, c]$$

for every $u\in U$, where the summation is over all the c such that $(u,c)\in E$. If $s(u)>=0$, bit u is decoded to be 1; otherwise, it is decoded to be 0.

Although only a few embodiments have been disclosed herein, other modifications are possible. For example, the inner coder is described as being close to rate 1. If the rate of the inner coder is less than one, certain bits can be punctured using puncturer 702, to increase the code rate.

What is claimed is:

1. A method of encoding a signal, comprising;

obtaining a portion of the signal to be encoded;

first encoding said portion in a way that repeats said portion to form a first encoded portion; and second encoding said first encoded portion using an encoder that has a rate close to one;

wherein said second encoding is via an accumulator; and wherein said second encoding by said accumulator uses a transfer function of $$\frac{1}{1 + D}.$$

2. A method as in claim 1 further comprising carrying out a plurality of serially concatenated interleaving operations.

3. A method as in claim 1 wherein there are one fewer interleaving operations than coding operations.

4. A method as in claim 1 further comprising puncturing bits, at specified intervals, to change an effective rate of the inner coder.

5. A method as in claim 1 further comprising coding information on separate branches of a tree structure.

6. A method as in claim 1 further comprising an additional coding, carried out by a middle coder which carries out coding with a rate less than or equal to one.

7. A method as in claim 6 wherein said middle coder comprises a q,n coder which codes blocks of length q to form blocks of length n.

8. A method as in claim 1 further comprising carrying out at least one additional encoding operation.

9. A method as in claim 8 wherein there are x encoding operations and x>1.

10. A method of encoding a signal, comprising:

obtaining a portion of the signal to be encoded;

first encoding said portion using a rate 1 coder, to repeat said portion to form a first encoded portion;

interleaving said first encoded portion to form an interleaved portion; and second encoding said first encoded interleaved portion using an encoder that has a rate close to ones, wherein said first encoding, said interleaving, and said second encoding is done according to a serial concatenated code, and forms a code that can be iteratively decoded;

wherein said second encoding is via an accumulator; and wherein said second encoding uses a transfer function of $$\frac{1}{(1 + D + D^2)}.$$

11. A coding system, comprising:

an outer coder, having an input which is configured to receive a stream of bits to be coded, to produce a first coded stream of bits at an output thereof at a coding rate less than rate 1;

an interleaver, receiving said first coded bits at its input, and producing second coded bits at an output, according to a specified interleaver function; and an inner coder receiving said second bits at an input thereof, and having an output connected to a channel, said inner coder coding the bits according to an inner code which is substantially rate 1, wherein said outer coder, said interleaver and said inner coder form a serially concatenated coder, and which form a code that can be iteratively decoded;

wherein said inner coder is an accumulator which encodes according to the transfer function $$\frac{1}{(1+D)}.$$

12. A device as in claim 11 wherein said inner code is within 10% of being rate 1.

13. A device as in claim 11 wherein said inner code is within 1% of being rate 1.

14. A system as in claim 11 wherein said outer coder is a coder which carries out a repetition code.

15. A system as in claim 11 wherein said outer coder is a concatenation of a plurality of short block coders.

16. A system as in claim 11 wherein said coding of bits are done in a tree form.

17. A system as in claim 16 wherein said tree has a separate branch which is encoded separately.

18. A system as in claim 11 further comprising at least one middle coder, wherein said middle coder operates at a rate which is either less than, or equal to one.

19. A system as in claim 18 wherein there are a plurality of said middle coders.

20. A system as in claim 19 wherein there are a plurality of said interleavers, and assuming if x is the number of coders, then x−1 is the number of interleavers.

21. A system as in claim 19 wherein said middle coders are (n,k) coders which receive a block of size k, and convert each said block to a block of size n, according to a predetermined technique.

22. A coding system, comprising an outer coder, having an input which is configured to receive a stream of bits to be coded, to produce a first coded stream of bits at an output thereof at a coding rate less than rate 1;

an interleaver, receiving said first coded bits at its input, and producing second coded bits at an output, according to a specified interleaver function; and an inner coder receiving said second bits at an input thereof, and having an output connected to a channel, said inner coder coding the bits according to an inner code which is substantially rate 1, wherein said outer coder, said interleaver and said inner coder form a serially concatenated coder, and which form a code that can be iteratively decoded;

wherein said inner coder encodes according to a transfer function $$\frac{1}{(1+D+D^2)}.$$

23. A coding system, comprising:

a first outer coder configured to receive a plurality of bits to be coded;

a second coder, configured to change the bits once coded by the outer coder, in a specified way, at a rate which is less than or equal to one; and a third rate one inner coder, configured to code the bits from the second coder at a rate, which is substantially rate one, to produce an output signal indicative thereof, and an iterative decoder, connected to receive said output signal and to iteratively decode the output signal;

wherein said inner coder is an accumulator;

wherein said accumulator has a transfer function $$\frac{1}{1+D}.$$

24. A system as in claim 23 further comprising an interleaver associated with the second coder.

25. A system as in claim 23 wherein the second coder is a n,k coder which receives k bits and produces an output of n bits.

26. A system as in claim 23 wherein said first outer coder is a repetition coder.

27. A system as in claim 23 wherein said inner coder is a digital filter with a specified transfer function.

28. A system as in claim 23 wherein said second coder comprises a plurality of said middle coders.

29. A system as in claim 28 wherein there are also a plurality of interleavers.

30. A coding system, comprising:

a first outer coder configured to receive a plurality of bits to be coded;

a second coder, configured to change the bits once coded by the outer coder, in a specified way, at a rate which is less than or equal to one; and a third rate one inner coder, configured to code the bits from the second coder at a rate, which is substantially rate one, to produce an output signal indicative thereof, and an iterative decoder, connected to receive said output signal and to iteratively decode the output signal;

wherein said inner coder has a transfer function of $$\frac{1}{(1+D+D^2)}.$$

31. A coding system, comprising;

a first outer coder, receiving a plurality of bits to be encoded, and encoding said bits with a rate less than one to produce a number of bits greater than a number of input bits;

a middle coder, receiving an output of said output coder, said middle coder having an encoding rate less than or equal to one, and producing middle encoded bits; and a rate one inner coder which has a coding rate which is substantially equal to one, and which produces an output for a channel, said rate one inner coder carrying out coding according to a specified transfer function; and an iterative decoder, connected to said channel to receive said output, and to iteratively decode the code;

wherein said inner coder has a transfer function of $$\frac{1}{1+D}.$$

32. A system as in claim 31 wherein said middle coder has a rate of one and further comprising an interleaver associated with said middle coder.

33. A system as in claim 31 wherein said middle coder comprises at least one additional coder and at least one interleaver, said additional coder having a rate less than one and coding according to an (n,k) code which produces blocks of size n for input blocks of size k.

34. A system as in claim 31 wherein said outer coder is a repetition coder.

35. A system as in claim 31 wherein said rate one inner coder is a linear coder.

36. A system as in claim 31 wherein said coding system is arranged as a tree, and further comprising an additional branch on the tree, both the first branch and the additional branch extending directly from input to output without recurring back or recombining with another branch.

37. A system as in claim 36 wherein said inner coder is an accumulator, and said additional branch includes an additional accumulator thereon.

38. A coding system, comprising:

a first outer coder, receiving a plurality of bits to be encoded, and encoding said bits with a rate less than one to produce a number of bits greater than a number of input bite;

a middle coder, receiving an output of said output coder, said middle coder having an encoding rate less than or equal to one, and producing middle encoded bits; and a rate one inner coder which has a coding rate which is substantially equal to one, and which produces an output for a channel, said rate one inner coder carrying out coding according to a specified transfer function; and an iterative decoder, connected to said channel to receive said output, and to iteratively decode the code wherein said inner coder has a transfer function of $$\frac{1}{(1+D+D^2)}.$$

39. A method of sending data over a channel comprising:

obtaining original digital data to be sent over a channel;

first encoding said data using an outer coder with a rate less than one, to produce outer coded data having additional bits beyond bits of the original digital data;

second interleaving said data using an interleaver which rearranges the bits according to a specified matrix; and inner coding the interleaved bits to form an output stream having the same number of bits as the interleaved bits according to a specified inner coding technique which is of the form from the group consisting of N/(1+D), or $N(1+D+D^2)$ and to produce output data, said output data being produced by a linear connection between each element which extends directly from input to output without recombinations or branches back to previous coding elements; and interatively decoding, said output data received over a channel.

40. A method as in claim 39 wherein said first decoding, interleaving and inner coding is carried out in a single tree from beginning to end.

41. A method as in claim 39 wherein said said inner coding is carried out in two separate branches on a single tree.

42. A method as in claim 39 further comprising, at another end of the channel, decoding said data using a posterior decoding techniques.

43. A method as in claim 39 further comprising a middle coding operation, said middle coding operation operating at a rate less than or equal to one using a specified coding technique.

44. A method as in claim 43 wherein said specified coding technique uses a double accumulator.

45. A method as in claim 39 further comprising, at the other end of the channel, decoding the data by using a Tanner graph representation.

46. A method as in claim 45 wherein said decoding comprises receiving a code and putting said code on a Tanner graph, iterating values of edge messages of the Tanner graph according to a specified rule by a specified number of times, and using the iterated values to determine an answer.

* * * * *